(12) United States Patent
Ishii et al.

(10) Patent No.: US 8,342,898 B2
(45) Date of Patent: Jan. 1, 2013

(54) ORGANIC ELECTROLUMINESCENCE DISPLAY DEVICE AND MANUFACTURING METHOD THEREOF

(75) Inventors: Yoshinori Ishii, Chiba (JP); Satoru Kase, Mobara (JP); Eiji Matsuzaki, Yokohama (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 178 days.

(21) Appl. No.: 12/272,921

(22) Filed: Nov. 18, 2008

(65) Prior Publication Data

US 2009/0128021 A1 May 21, 2009

(30) Foreign Application Priority Data

Nov. 19, 2007 (JP) .................. 2007-299262

(51) Int. Cl.
*H01J 9/26* (2006.01)
*H01L 51/50* (2006.01)
*H01L 51/56* (2006.01)

(52) U.S. Cl. .......... 445/25; 313/504; 313/503; 313/512; 445/24

(58) Field of Classification Search .............. 257/40, 257/72, 98–100, 642–643, 759, 75; 313/498–512; 315/169.1, 169.3; 427/58, 64, 66, 532–535, 427/539; 428/690–691, 917; 438/26–29, 438/82, 455, 33–34; 445/24–25

See application file for complete search history.

(56) References Cited

U.S. PATENT DOCUMENTS

| | | | |
|---|---|---|---|
| 2003/0098648 A1* | 5/2003 | Miwa et al. | 313/506 |
| 2006/0135029 A1* | 6/2006 | Harada | 445/25 |

FOREIGN PATENT DOCUMENTS

| | | |
|---|---|---|
| JP | 2004-311226 | 4/2004 |
| JP | 2004-139977 | 5/2004 |
| JP | 2006-066364 | 3/2006 |
| JP | 2007-005107 | 1/2007 |
| JP | 2007-273400 | 10/2007 |

OTHER PUBLICATIONS

Nikkei Electronics No. 960, pp. 10-11, Sep. 10, 2007, Nikkei Business Publications, Inc. JP, Shinya Saeki.
Office Action in CN 200810177764.2, dated Nov. 27, 2009, (5 pgs.) [in Chinese].

* cited by examiner

*Primary Examiner* — Mariceli Santiago
*Assistant Examiner* — Donald Raleigh
(74) *Attorney, Agent, or Firm* — Antonelli, Terry, Stout & Kraus, LLP.

(57) ABSTRACT

A bonding agent sheet (30) including removed bonding agent portions (31) corresponding to terminal portions (102) is bonded to a mother sealing substrate (400). Further, a mother element substrate (100) including display regions (101) and the terminal portions (102) is bonded to the bonding agent sheet (30) to form a mother panel (200). Then, the mother panel (200) is separated into individual organic EL display panels to form organic EL display devices.

15 Claims, 13 Drawing Sheets

A-A

B-B

A-A

A-A

A-A

A-A

A-A

ORGANIC ELECTROLUMINESCENCE DISPLAY DEVICE AND MANUFACTURING METHOD THEREOF

CROSS-REFERENCE TO RELATED APPLICATION

The present application claims priority from Japanese application JP2007-299262 filed on Nov. 19, 2007, the content of which is hereby incorporated by reference into this application.

BACKGROUND OF THE INVENTION

1. Field of the Invention

The present invention relates to an organic electroluminescence (EL) display device, and more particularly, to a reliable organic EL display device in which occurrence of a dark spot caused by moisture is suppressed, and a method of manufacturing the same.

2. Description of the Related Art

In an organic EL display device, an organic EL layer is sandwiched between a pixel electrode (lower electrode) and an upper electrode, and, by applying a constant voltage to the upper electrode and a data signal voltage to the lower electrode, light emission of the organic EL layer is controlled, thereby forming an image. Supply of the data signal voltage to the lower electrode is carried out via a thin film transistor (TFT). Organic EL display devices are classified into a bottom emission type, in which light emitted from the organic EL layer is extracted toward a glass substrate which has the organic EL layer etc. formed thereon, and a top emission type, in which light emitted from the organic EL layer is extracted toward the opposite direction of the glass substrate which has the organic EL layer etc. formed thereon.

The light emitting property of an organic EL material used in the organic EL display device is degraded if moisture exists therein, and, when an operation is performed for a long period of time, the organic EL material becomes unable to emit light at a place where the light emitting property has been degraded due to the moisture. That place appears as a dark spot in a display region. This dark spot grows with time, and becomes a defect in an image. Note that a phenomenon called edge growth, in which a non-light emitting region increases around the periphery of a pixel, is also caused by the influence from moisture.

In order to prevent the occurrence or growth of a dark spot or the like, it is necessary to prevent ingress of moisture into the organic EL display device or to remove ingressed moisture. Accordingly, an element substrate having the organic EL layer formed thereon is sealed with a sealing substrate via sealing agents provided around the element substrate, thereby preventing moisture from ingressing into the organic EL display device from the outside. A space within the sealed portion is filled with an inert gas such as $N_2$. On the other hand, in order to remove the moisture which has ingressed into the organic EL display device, a desiccant is provided within the organic EL display device. Such an organic EL display device is referred to as hollow sealing organic EL display device.

The hollow sealing organic EL display device has such problems as a difficulty in adjusting a gap between the element substrate and the sealing substrate, a difficulty in adjusting a pressure inside the sealed portion, contamination of the organic EL material due to a gas emitted from a sealing agent when sealing using the sealing agent, and low throughput.

As a measure for addressing the problems with the hollow sealing, there exists a technology in which the organic EL material is protected against moisture by means of a resin sheet which has a fixed film thickness and is sandwiched between the element substrate and the sealing substrate. This is referred to as solid sealing.

In JP 2004-139977 A, there is described an example of the solid sealing, and FIGS. 16A to 16D illustrate a configuration described in JP 2004-139977 A. Referring to FIGS. 16A to 16D, a photo-curing resin 120 formed on a film 110 having optical transparency is bonded, with the use of a pressure roller 105 which is heated up to 80° C., on an element substrate 10 provided with organic EL layers 22. Subsequently, by irradiating ultraviolet light, the photo-curing resin 120 is cured, and then, the film 110 having optical transparency is peeled off, thereby obtaining an organic EL display device which is sealed with the photo-curing resin. In addition, there is described a configuration in which the organic EL element is covered with a silicon nitride film if necessary.

In "Shinya Saeki, Nikkei Electronics, Sep. 10, 2007, No. 960, pp. 10-11", as illustrated in FIGS. 17A to 17E, there is described a technology for sealing an organic EL display device as follows. Specifically, at a portion of a sealing substrate 40, which corresponds to an organic EL element 22, a resin film 107 is bonded, and then, a sealing agent 108 is printed around the resin film 107. The sealing substrate 40 having the resin films 107 and the sealing agents 108 formed thereon and an element substrate 10 having the organic EL elements 22 formed thereon are bonded together. Then, by irradiating ultraviolet light from the sealing substrate 40 side, a heating treatment at temperature of from 80° C. to 100° C. is performed, to thereby cure the sealing agent 108. At the same time, the resin film 107 which has started to have fluidity spreads across a space formed with the sealing substrate 40, the element substrate 10, and the sealing agent 108, and fills up the space. Lastly, the bonded substrates are divided into individual organic EL display panels as finished pieces.

In JP 2006-066364 A, there is described a configuration in which: a plurality of display elements are formed on a mother substrate; a sealing film is formed as a whole with respect to the plurality of display elements; and then, a protection film is removed from a terminal portion through laser ablation. FIGS. 18A and 18B illustrate the configuration described in JP 2006-066364 A, in which the plurality of display elements each including a light emitting portion 207 and terminal portions 209 are formed on a mother substrate 206, and are covered with a protection film 208. The protection film 208 is removed through laser ablation from parts 210 of each of the terminal portions 209, thereby forming opening portions 210.

With regard to the technology described in JP 2004-139977 A, there is described a configuration in which a resin sheet is bonded to individual organic EL display devices to protect the organic EL layer. However, there is no description or suggestion as to problems and the like which arise in a case where, with covering performed with the resin sheet, a plurality of organic EL panels are formed on a mother substrate and separated into individual pieces.

With the technology described in "Shinya Saeki, Nikkei Electronics, Sep. 10, 2007, No. 960, pp. 10-11", it is necessary to achieve a balance in height between the resin film and the sealing agent, and, if an imbalance in height occurs, the lifetime of the organic EL display device is shortened. Further, with this technology, the resin film spreads, showing fluidity in a heating process after the sealing. As a result, however, a pressure within the organic EL display device is increased, and then, a leak path connecting to the outside is formed, posing a risk of shortening the lifetime of the organic EL display device. In addition, there is a risk of impairing the sealing performance due to the influence on the resin sheet from a gas emitted while the sealing agent is curing.

With the technology described in JP 2006-066364 A, after one resin sheet is bonded to the mother substrate having a plurality of organic EL display panels formed thereon, in order to remove the resin sheet for each of the terminals of the individual organic EL panels, processing is performed for the opening portions. As a result, the production capability becomes small. It is necessary to increase the number of facilities so as to increase the amount of production, which leads to an increase in production cost. Besides, for the ablation, a laser beam is employed at high energy, and hence there arises a problem of damaging a connection terminal. Further, in the removal using the laser beam, there is a fear that a residual resin sheet remains on the terminal.

SUMMARY OF THE INVENTION

It is an object of the present invention to overcome the above-mentioned problems so as to realize a solid sealing organic EL display device which has high reliability in sealing and has high throughput.

The present invention solves the above-mentioned problems, and specific means therefor are as follows.

(1) A method of manufacturing an organic electroluminescence display device which includes: an element substrate including: a display region; and a terminal portion; a bonding agent sheet formed to cover the display region; and a sealing substrate bonded to the bonding agent sheet, includes: forming the organic electroluminescence display device by separating a mother panel, the mother panel including: a mother sealing substrate having a plurality of the sealing substrates formed thereon; a mother element substrate having a plurality of the element substrates formed thereon; and the bonding agent sheet for bonding the mother sealing substrate and the mother element substrate; and bonding the bonding agent sheet to the mother sealing substrate in a manner that the bonding agent sheet covers a plurality of the display regions formed on the mother element substrate and in a manner that the bonding agent sheet avoids covering a plurality of the terminal portions formed on the mother element substrate.

(2) In a method of manufacturing an organic electroluminescence display device according to (1), the bonding agent sheet bonded to the mother sealing substrate includes one bonding agent sheet, and the bonding agent sheet is removed from portions corresponding to the plurality of the terminal portions of the plurality of the element substrates formed on the mother element substrate.

(3) In a method of manufacturing an organic electroluminescence display device according to (1), a plurality of the bonding agent sheets are bonded to the mother sealing substrate to cover the plurality of the display regions formed on the plurality of the element substrates, and the plurality of the bonding agent sheets avoid covering portions corresponding to the plurality of the terminal portions of the plurality of the element substrates formed on the mother element substrate.

(4) A method of manufacturing an organic electroluminescence display device which includes: an element substrate including: a display region; and a terminal portion; a bonding agent formed to cover the display region; and a sealing substrate bonded to the bonding agent, includes: forming the organic electroluminescence display device by separating a mother panel, the mother panel including: a mother sealing substrate having a plurality of the sealing substrates formed thereon; a mother element substrate having a plurality of the element substrates formed thereon; and the bonding agent for bonding the mother sealing substrate and the mother element substrate; and forming, through printing, the bonding agent on the mother sealing substrate in a manner that the bonding agent covers a plurality of the display regions formed on the mother element substrate and in a manner that the bonding agent avoids covering a plurality of the terminal portions formed on the mother element substrate.

(5) In a method of manufacturing an organic electroluminescence display device according to (4), the bonding agent printed on the mother sealing substrate has a continuous surface, and the bonding agent is prevented from being printed on portions of the mother sealing substrate, which correspond to the plurality of the terminal portions of the plurality of the element substrates formed on the mother element substrate.

(6) In a method of manufacturing an organic electroluminescence display device according to (4), a plurality of the bonding agents, which are formed to cover the plurality of the display regions formed on the plurality of the element substrates through the printing, and each of which has a continuous surface, are formed on the mother sealing substrate, and the plurality of the bonding agents are prevented from being printed on portions of the mother sealing substrate, which correspond to the plurality of the terminal portions of the plurality of the element substrates formed on the mother element substrate.

(7) An organic electroluminescence display device includes: an element substrate including: a display region; and a terminal portion; a bonding agent sheet formed to cover the display region; and a sealing substrate bonded to the bonding agent sheet, in which: on a side of the sealing substrate, which has the terminal portion formed, an end portion of the bonding agent sheet is one of being aligned on the same plane as an end portion of the sealing substrate and being recessed inward from the end portion of the sealing substrate; and on at least one of two sides perpendicular to the side having the terminal portion formed, another end portion of the bonding agent sheet is one of protruding outward from another end portion of the sealing substrate or an end portion of the element substrate and being aligned on the same plane as the another end portion of the sealing substrate or the end portion of the element substrate.

(8) In an organic electroluminescence display device according to (7), on an opposite side of the side having the terminal portion formed, yet another end portion of the bonding agent sheet is one of protruding outward from yet another end portion of the sealing substrate or another end portion of the element substrate and being aligned on the same plane as the yet another end portion of the sealing substrate or the another end portion of the element substrate.

(9) An organic electroluminescence display device includes: an element substrate including: a display region; and a terminal portion; a bonding agent formed to cover the display region; and a sealing substrate bonded to the bonding agent, in which: the bonding agent is formed through printing; on a side of the sealing substrate, which has the terminal portion formed, an end portion of the bonding agent is one of being aligned on the same plane as an end portion of the sealing substrate and being recessed inward from the end portion of the sealing substrate; and on at least one of two sides perpendicular to the side having the terminal portion formed, another end portion of the bonding agent is one of protruding outward from another end portion of the sealing substrate or an end portion of the element substrate and being aligned on the same plane as the another end portion of the sealing substrate or the end portion of the element substrate.

(10) In an organic electroluminescence display device according to (9), on an opposite side of the side having the terminal portion formed, yet another end portion of the bonding agent is one of protruding outward from yet another end portion of the sealing substrate or another end portion of the element substrate and being aligned on the same plane as the yet another end portion of the sealing substrate or the another end portion of the element substrate.

The bonding agent sheet is bonded to the portions of the mother sealing substrate, which correspond to regions of the mother element substrate, in which the plurality of the display regions are formed, whereas the bonding agent sheet is not formed on the portions which correspond to regions of the mother element substrate, in which the plurality of the terminal portions are formed. As a result, after individual organic EL display devices are separated from the mother panel formed by bonding the mother element substrate and the mother sealing substrate, there is no need to remove the bonding agent sheet from the plurality of the terminal portions. Thus, it is possible to eliminate a risk of causing damage to the terminal portion while removing the bonding agent from the terminal portion. In addition, it is possible to prevent a bonding residue from remaining in the terminal portion after the removing.

Further, in a case where, instead of using the bonding agent sheet, the bonding agent is printed on the sealing substrate through the printing in the same manner as described above, it is possible to achieve the solid sealing at low cost.

According to embodiments of the present invention, it is possible to perform the solid sealing using the bonding agent sheet, and hence it is possible to realize an organic EL display device having enhanced reliability and productivity.

DETAILED DESCRIPTION OF THE PREFERRED EMBODIMENTS

Figure 1:
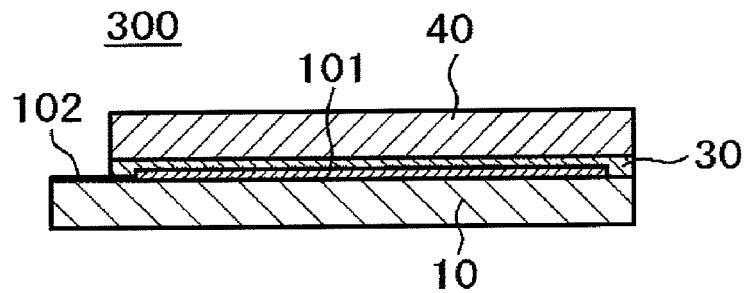
FIG. 1 is a cross section of an organic EL display device according to embodiments of the present invention.

Prior to a specific description of a configurational example of an organic electroluminescence (EL) display device according to embodiments of the present invention, an outline of a configuration of the organic EL display device according to the embodiments of the present invention is made. FIG. 1 is a cross section of an organic EL display panel 300 which is included in the organic EL display device according to the embodiments of the present invention. Referring to FIG. 1, on an element substrate 10, there is formed a display region 101 in which organic EL layers for displaying an image, thin film transistors (TFTs) for driving, and the like are disposed in matrix.

In such a manner as to cover the display region 101, there is provided a bonding agent sheet 30, which also serves as a sealing material. By means of the bonding agent sheet 30, a sealing substrate 40 made of glass is bonded to the element substrate 10. As the bonding agent sheet 30, a thermosetting epoxy resin is employed. Thickness of the bonding agent is from 10 μm to 20 μm. Note that the bonding agent sheet 30 is not limited to the epoxy resin and may be an acrylic resin or a silicon resin.

It is preferable that the bonding agent sheet 30 be of a moisture proof material, but the bonding agent sheet 30 does not necessarily need to provide a strong barrier against moisture. This is because the sealing substrate 40 made of glass mainly serves as a barrier against moisture. It therefore follows that, with the configuration illustrated in FIG. 1, ingress of moisture from above is blocked by the sealing substrate 40 made of glass while moisture has to travel a long distance to reach the organic EL layer from the side.

On an end portion of the element substrate 10, a terminal portion 102 for supplying power, a video signal, etc. to the organic EL layer of the display region 101 is provided in an extended manner. The terminal portion 102 is not covered with the bonding agent, but wirings thereof are covered with an inorganic passivation film or an organic passivation film, to thereby prevent a conductive film of the terminal portion 102 from corroding. Besides, the conductive film is not affected so much by moisture as the organic EL layer is.

FIG. 1 illustrates so-called solid sealing, in which there is no space formed between the sealing substrate 40 and the element substrate 10. Accordingly, unlike the case of the hollow sealing, there never arises a problem that, when the sealing substrate 40 is pressed, a black spot occurs because the sealing substrate 40 is brought into contact with the element substrate 10. Besides, in the course of sealing, various problems caused by an internal pressure of a sealing gas are also prevented.

According to the embodiments of the present invention, a plurality of the organic EL display panels 300 illustrated in FIG. 1 are formed on a mother panel 200. After a large-sized bonding agent sheet 30 for bonding a mother element substrate 100 and a mother sealing substrate 400 is bonded to the mother sealing substrate 400, the mother sealing substrate 400 and the mother element substrate 100 are bonded together. The embodiments of the present invention are characterized by a method in which the bonding agent sheet 30 is provided to the display region 101 while the bonding agent sheet 30 is not provided to the terminal portion 102.

Figure 2:
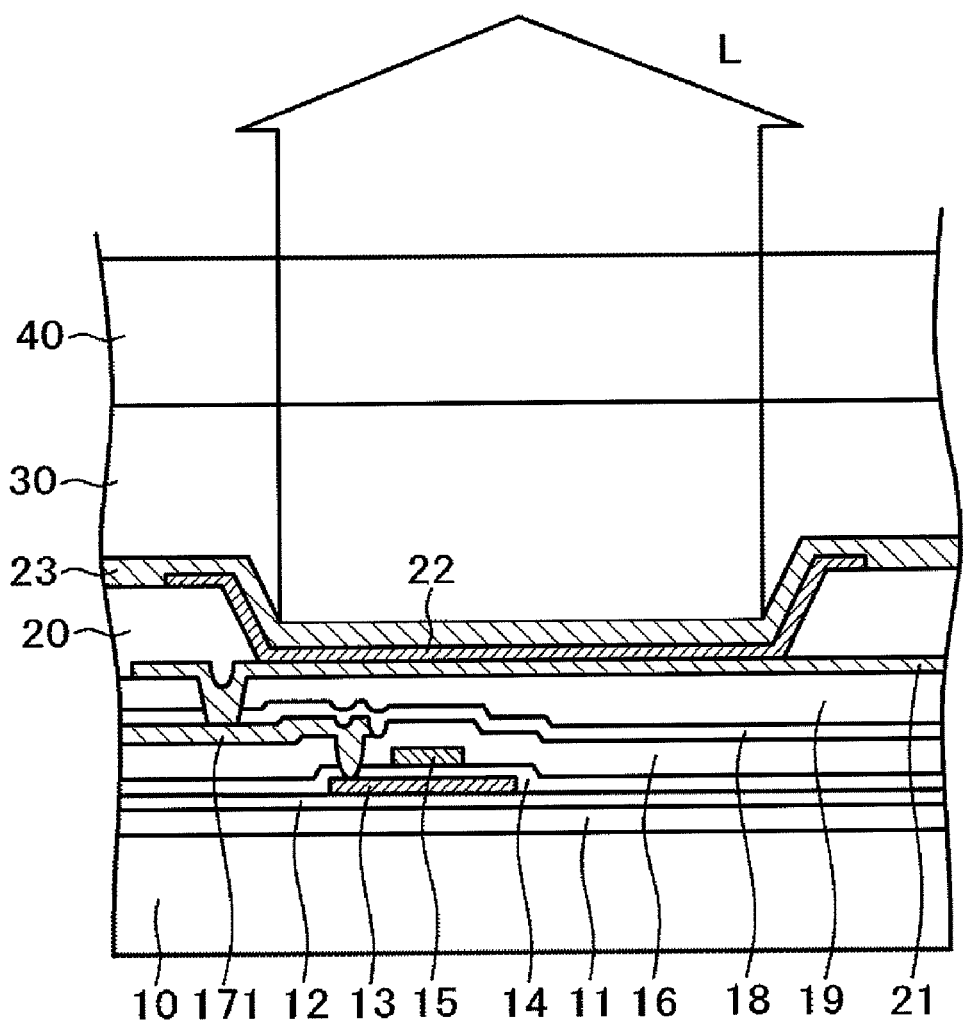
FIG. 2 is a cross section of a display region of an organic EL display panel.

FIG. 2 is a cross section of a display region in a case where the organic EL display device according to the embodiments of the present invention is of a top emission type. In the embodiments of the present invention, a description is made taking an organic EL display device of the top emission type as an example, but the present invention can also be applied to an organic EL display device of a bottom emission type. Top emission type organic EL display devices are classified into a top anode type, in which an anode is placed above the organic EL layer, and a top cathode type, in which a cathode is placed above the organic EL layer. FIG. 2 illustrates the case of the top anode type, but the present invention can also be applied to the case of the top cathode type.

Referring to FIG. 2, on the element substrate 10, a first base film 11 made of SiN and a second base film 12 made of $SiO_2$ are formed. This configuration is made in order to prevent impurities which enter from the glass substrate from contaminating a semiconductor layer 13. On the second base film 12, the semiconductor layer 13 is formed. The semiconductor layer 13 is formed as an amorphous silicon (a-Si) film by chemical vapor deposition (CVD), and then is transformed into a polycrystalline silicon (poly-Si) film through laser irradiation.

A gate insulating film 14 made of $SiO_2$ is formed in such a manner as to cover the semiconductor layer 13. A gate electrode 15 is formed on a portion which is opposed to the semiconductor layer 13 with the gate insulating film 14 sandwiched therebetween. By using the gate electrode 15 as a mask, an impurity such as phosphorus or boron is doped into the semiconductor layer 13 through ion implantation. As a result, electrical conductivity is provided to the semiconductor layer 13, and a source region and a drain region are formed in the semiconductor layer 13.

An interlayer insulating film 16 is formed using $SiO_2$ in such a manner as to cover the gate electrode 15. This configuration is made in order to insulate a gate wiring from a drain wiring 171. The drain wiring 171 is formed on the interlayer insulating film 16. The drain wiring 171 is connected to the drain region of the semiconductor layer 13 via a through hole which is formed in the interlayer insulating film 16 and the gate insulating film 14.

Then, in order to protect a thin film transistor (TFT) fabricated in the above-mentioned manner, an inorganic passivation film 18 made of SiN is bonded thereto. On the inorganic passivation film 18, an organic passivation film 19 is formed. The organic passivation film 19 serves to make protection for the TFT more complete along with the inorganic passivation film 18, as well as serves to make flat a surface on which an organic EL layer 22 is formed. Accordingly, the organic passivation film 19 is formed thick, having thickness of from 1 µm to 4 µm.

On the organic passivation film 19, a reflecting electrode is formed using Al or Al alloy. Al or Al alloy is high in reflectance, and therefore is suitable as the reflecting electrode. The reflecting electrode is connected to the drain wiring 171 via a through hole formed in the organic passivation film 19 and the inorganic passivation film 18.

The organic EL display device according to the embodiments of the present invention is of the top anode type, and hence a lower electrode 21 for the organic EL layer 22 is a cathode. Accordingly, Al or Al alloy used as the reflecting electrode can be also used as the lower electrode 21 for the organic EL layer 22. This is because Al or Al alloy is relatively small in work function, which allows Al or Al alloy to function as a cathode.

On the lower electrode 21, the organic EL layer 22 is formed. The organic EL layer 22 includes an electron transport layer, a light emitting layer, and a hole transport layer in order from bottom. Note that, in some cases, an electron injection layer is provided between the electron transport layer and the lower electrode 21. Further, in some cases, a hole injection layer is provided between the hole transport layer and an upper electrode 23. On the organic EL layer 22, the upper electrode 23 is formed as an anode. In the embodiments of the present invention, IZO is used as the upper electrode 23. IZO is deposited on the entire display region without using a mask. Thickness of IZO is set at around 30 nm so as to keep sufficient light transmission. Instead of IZO, ITO may be used.

The electron transport layer is not particularly limited as long as the layer exhibits the electron transporting property and is easily formed into a charge transfer complex by being co-deposited with an alkali metal. For example, the following may be used: metal complexes such as tris(8-quinolinolato) aluminum, tris(4-methyl-8-quinolinolato)aluminum, bis(2-methyl-8-quinolinolato)-4-phenyl phenolate-aluminum, and bis[2-[2-hydroxyphenyl]benzoxazolate]zinc; 2-(4-biphenylyl)-5-(4-tert-butylphenyl)-1,3,4-oxadiazole; and 1,3-bis[5-(p-tert-butylphenyl)-1,3,4-oxadiazole-2-yl]benzene.

The material for the light emitting layer is not particularly limited as long as the material can be formed into a light emitting layer by a co-deposition of a host material having electron and hole transporting ability added with a dopant exhibiting fluorescence or phosphorescence as a result of recombination of the electron and the hole. Examples of the host may include: complexes such as tris(8-quinolinolato) aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolato lithium, tris(5-chloro-8-quinolinolato)gallium, bis(5-chloro-8-quinolinolato)calcium, 5,7-dichloro-8-quinolinolato aluminum, tris(5,7-dibromo-8-hydroxyquinolinolato)aluminum, and poly[zinc (II)-bis(8-hydroxy-5-quinolinyl)methane]; anthracene derivatives; and carbazole derivatives.

In addition, the dopant emits light by capturing and recombining an electron and a hole in the host. The dopant, for example, may be a substance emitting fluorescence such as a pyran derivative emitting red light, a coumarin derivative emitting green light, or an anthracene derivative emitting blue light, or a substance such as an iridium complex or a pyridinato derivative, each of which exhibits phosphorescence.

As the hole transport layer, for example, a tetraaryl benzidine compound (triphenyl diamine: TPD), an aromatic tertiary amine, a hydrazone derivative, a carbazole derivative, a triazole derivative, an imidazole derivative, an oxadiazole derivative having an amino group, a polythiophene derivative, or a copper phthalocyanine derivative may be used.

In order to prevent the organic EL layer 22 from being broken at end portions thereof due to disconnection caused by step, a bank 20 is formed between pixels. The bank 20 may be formed with an organic material or may be formed with an inorganic material such as SiN. In the case of using the organic material, the bank 20 is formed with an acrylic resin in general.

In some cases, on the upper electrode 23 formed on the bank 20, an auxiliary electrode is used to assist conduction. This is because, when a resistance of the upper electrode 23 is large, brightness fluctuations may occur. In the embodiments of the present invention, the auxiliary electrode is not used, but it is apparent that the present invention can be applied to an organic EL display device which uses the auxiliary electrode.

On the upper electrode 23, the bonding agent sheet 30 is formed. The bonding agent sheet 30 is made of a thermosetting epoxy resin, and bonds the element substrate 10, more specifically, the upper electrode 23 to the sealing substrate 40 made of glass. The thickness of the bonding agent sheet 30 is from 10 μm to 20 μm. The sealing substrate 40 is bonded to the bonding agent sheet 30, and hence the organic EL layer 22 is protected against moisture by the sealing substrate 40.

Hereinbelow, a detailed description is made of some exemplary embodiments of the present invention.

First Embodiment

Figure 3A:
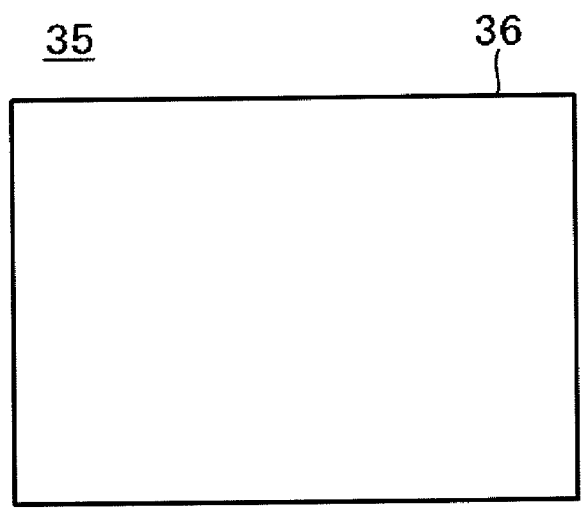
FIGS. 3A and 3B illustrate a bonding agent film before processing.
Figure 3B:
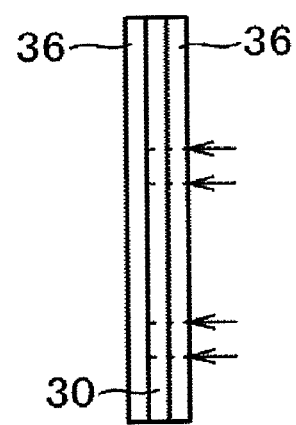

FIGS. 3A, 3B, 4A, and 4B illustrate a bonding agent film 35 being in a state in which a sheet-form bonding agent 30, which is used in a first embodiment of the present invention, is protected with protection films 36. FIGS. 3A and 3B illustrate a state of one large-sized sheet of the bonding agent film 35. In FIGS. 3A and 3B, a large-sized bonding agent sheet 30 is sandwiched by large-sized sheets of the protection films 36 made of polyethylene terephthalate (PET). As indicated by the arrows in FIG. 3B, cuts are made by a cutter in the bonding agent film 35 illustrated in FIGS. 3A and 3B. After that, parts of the bonding agent film 35 are removed.

Figure 4A:
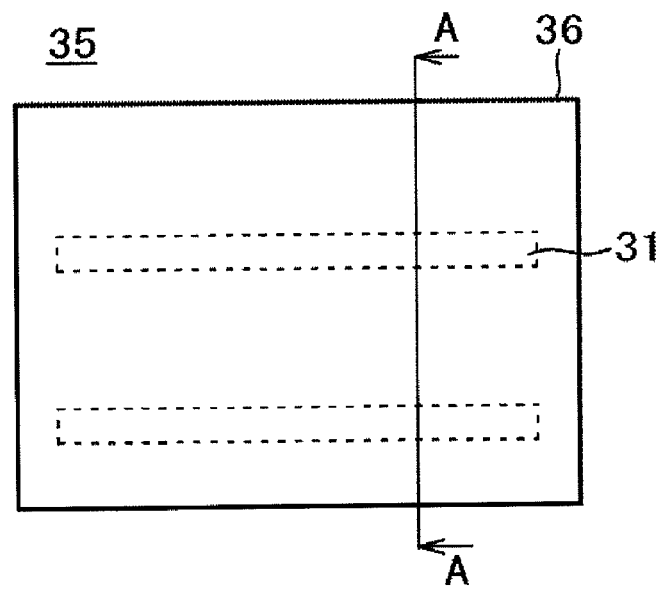
FIGS. 4A and 4B illustrate a bonding agent film according to a first embodiment of the present invention.
Figure 4B:
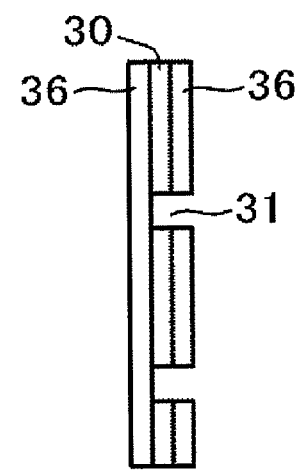

FIGS. 4A and 4B illustrate a state in which the parts of the bonding agent film 35 are removed. FIG. 4A is a plan view, and FIG. 4B is a cross section taken along the line A-A of FIG. 4A. In FIG. 4A, a surface of the protection film 36 is illustrated, and parts of the bonding agent sheet 30 bonded to the underside of the protection film 36 are removed in a long rectangular shape. FIG. 4B is a cross section of the bonding agent film 35 in which removed bonding agent portions 31 are formed.

Figure 5A:
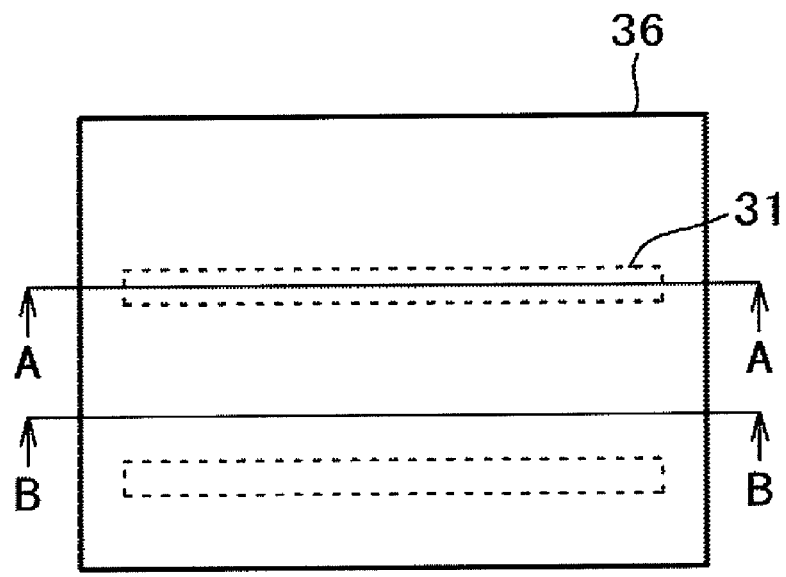
FIGS. 5A, 5B, and 5C are diagrams illustrating a state in which a bonding agent sheet with a protection film according to the first embodiment of the present invention is bonded to a mother sealing substrate.
Figure 5B:
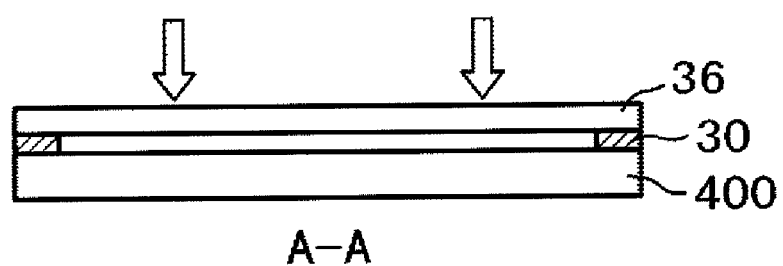

In FIG. 4B, the protection film 36 bonded to the underside of the bonding agent sheet 30 is removed, and then, as illustrated in FIGS. 5A and 5B, the bonding agent sheet 30 is bonded to the mother sealing substrate 400. In order to prevent air bubbles from being trapped, this bonding is performed at a temperature of around 80° C. under a reduced pressure. At around 80° C., the bonding agent sheet 30 does not harden sufficiently, but the bonding agent sheet 30 possesses a certain level of adhesion. Accordingly, the bonding agent sheet 30 can be bonded to the mother sealing substrate 400 with a certain level of strength.

Figure 5C:
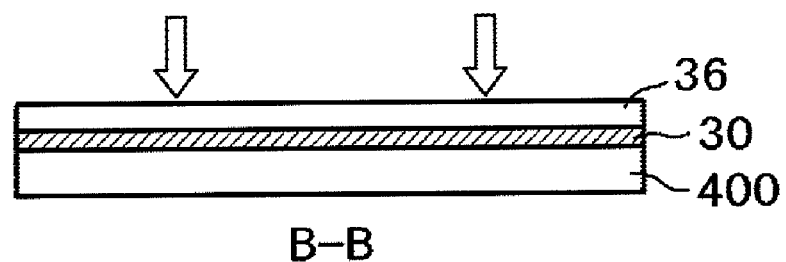

FIG. 5A illustrates a state in which the bonding agent sheet 30 is bonded to the mother sealing substrate 400. In FIG. 5A, a surface of the protection film 36 for the bonding agent sheet 30 is illustrated. The dashed lines illustrated in FIG. 5A indicate the removed bonding agent portions 31 in the bonding agent sheet 30. FIG. 5B is a cross section taken along the line A-A of FIG. 5A, illustrating a cross section of the portion at which the bonding agent sheet 30 is removed. In this portion, only at the sides thereof, the bonding agent sheet 30 is sandwiched between the protection film 36 and the mother sealing substrate 400. FIG. 5C is a cross section taken along the line B-B of FIG. 5A, illustrating a state in which the bonding agent sheet 30 is sandwiched between the protection film 36 and the mother sealing substrate 400.

Figure 6A:
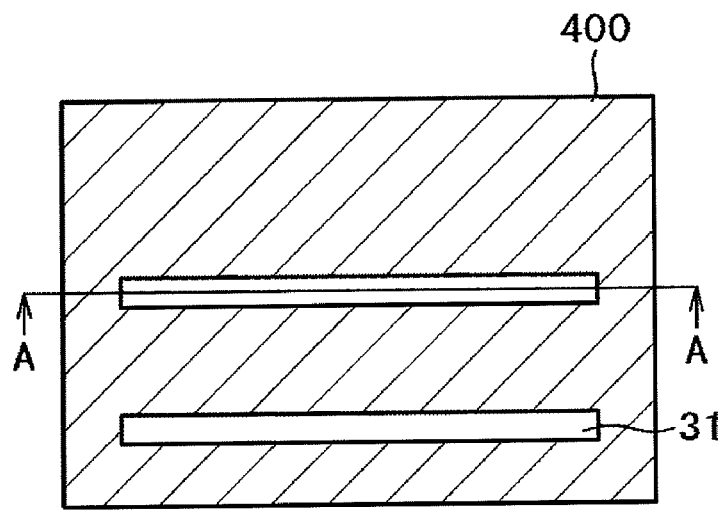
FIGS. 6A and 6B are diagrams illustrating a state in which a bonding agent sheet according to the first embodiment of the present invention is bonded to the mother sealing substrate.
Figure 6B:
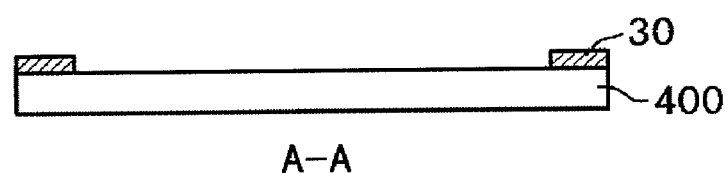

FIGS. 6A and 6B illustrate a state in which the bonding agent sheet 30 is bonded to the mother sealing substrate 400 with the protection film 36 peeled off. FIGS. 6A and 6B illustrate the mother sealing substrate 400, from which a plurality of sealing substrates 40 are formed. FIG. 6B is a cross section taken along the line A-A of FIG. 6A. The mother sealing substrate 400 is entirely covered with the bonding agent sheet 30 except for the removed bonding agent portions 31 in a long rectangular shape, which are to correspond to the terminal portions 102 formed on the element substrates 10.

Figure 7:
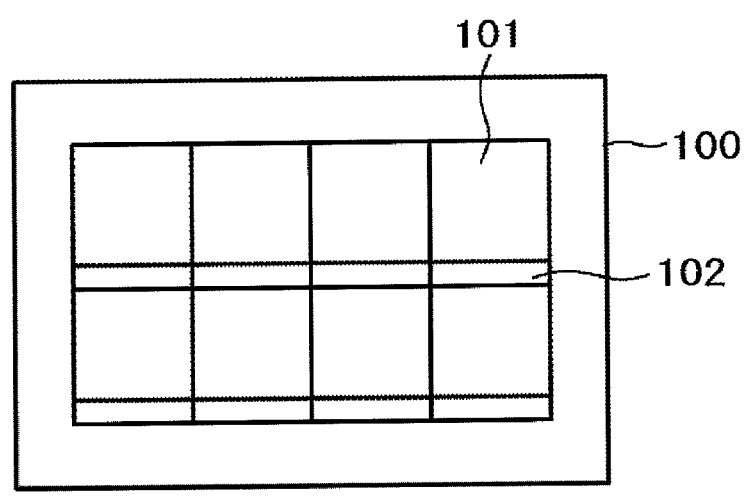
FIG. 7 is a plan view of a mother element substrate.

FIG. 7 is a plan view of the mother element substrate 100, which has eight element substrates 10 formed thereon. On each of the element substrates 10, the display region 101 and the terminal portion 102 are formed. A feature according to this embodiment of the present invention is that the terminal portion 102 of the mother element substrate 100 illustrated in FIG. 7 corresponds to the removed bonding agent portion 31 of the mother sealing substrate 400 illustrated in FIG. 6A.

Figure 8A:
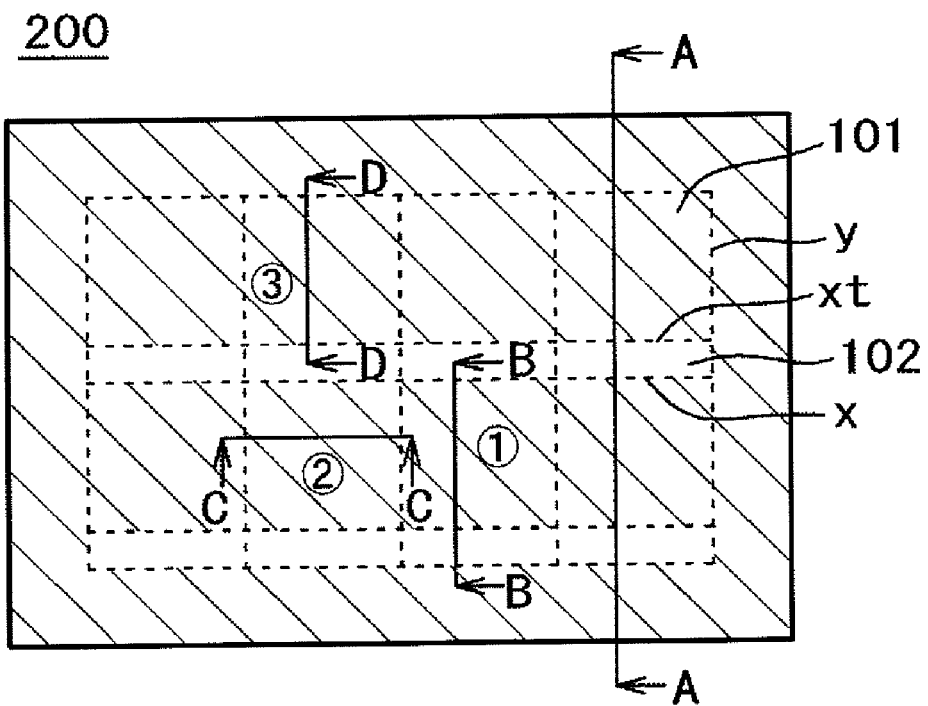
FIGS. 8A and 8B illustrate a mother panel according to the first embodiment of the present invention.
Figure 8B:
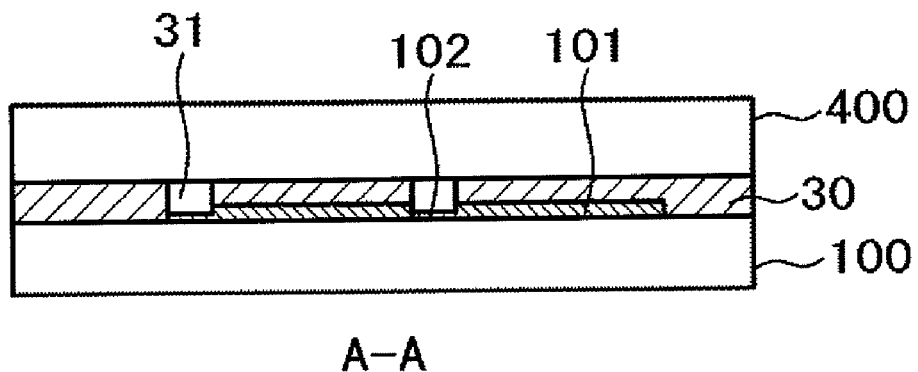

FIGS. 8A and 8B illustrate the mother panel 200 in which the mother sealing substrate 400 illustrated in FIGS. 6A and 6B is bonded to the mother element substrate 100 illustrated in FIG. 7 by means of the bonding agent sheet 30. FIG. 8A is a plan view of the mother panel 200 viewed from the mother sealing substrate 400 side, whereas FIG. 8B is a cross section taken along the line A-A of FIG. 8A. The bonding of the mother sealing substrate 400 and the mother element substrate 100 is performed by applying a pressure to the mother element substrate 100 from the mother sealing substrate 400 in a reduced pressure atmosphere while heating at the same time. A heating condition is, for example, at 100° C. for 2 hours, or at 120° C. for about 30 minutes. Through this heating, the bonding agent sheet 30 is cured, thereby firmly bonding the mother sealing substrate 400 and the mother element substrate 100 together. In addition, ingress of moisture from the interface can be prevented.

In FIG. 8A, a hatched portion indicates a portion to which the bonding agent sheet 30 is provided. In FIG. 8B, on the display region 101 formed on the mother element substrate 100, the bonding agent sheet 30 is formed. On the bonding agent sheet 30, the mother sealing substrate 400 is bonded. On the other hand, on the terminal portion 102 formed on the mother element substrate 100, there is no bonding agent sheet 30 existing. Accordingly, when the mother panel 200 is separated into individual organic EL display devices, the bonding agent sheet 30 and the sealing substrate 40 do not exist above the terminal portion 102.

After the mother element substrate 100 is bonded to the mother sealing substrate 400, as illustrated in FIG. 8A, scribing is carried out along a dashed line x and a dashed line y from the mother element substrate 100 side. Further, scribing is also carried out along a dashed line xt from the mother sealing substrate 400 side. After that, by inflicting an impact on the glass substrate from the mother element substrate 100 side, the mother panel 200 is broken along the dashed line x and the dashed line y, thereby being separated into individual organic EL display devices. After the organic EL display panel 300 is separated into individual pieces, an impact is inflicted onto the glass substrate along the scribing xt from the sealing substrate 40 side. As a result, the sealing substrate 40 formed above the terminal portion 102 is broken, and then is removed, thereby exposing the terminal portion 102 formed on the element substrate 10.

The individual organic EL display panels 300 are separated from the mother panel 200 using the above-mentioned method, and hence the cross sections thereof are different from each other depending on the positions at which the individual organic EL display panels 300 are separated.

Figure 9A:
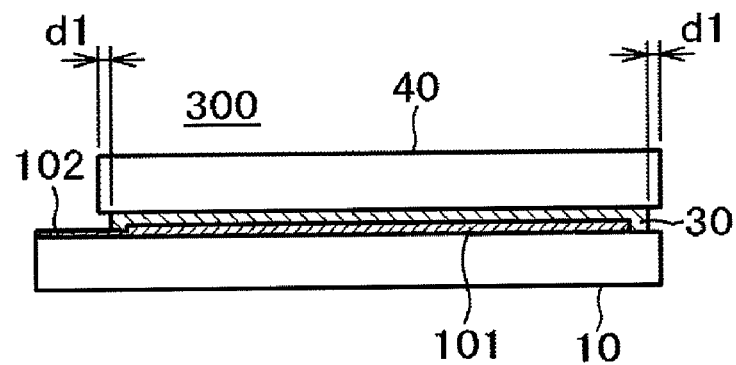
FIGS. 9A, 9B, and 9C are cross sections of organic EL display panels formed in the first embodiment of the present invention.
Figure 9B:
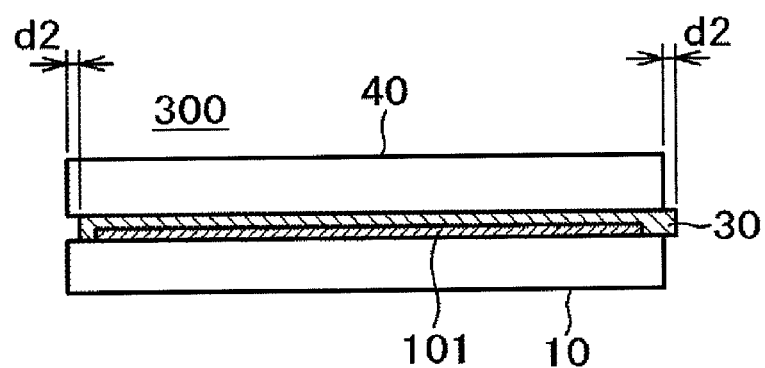
Figure 9C:
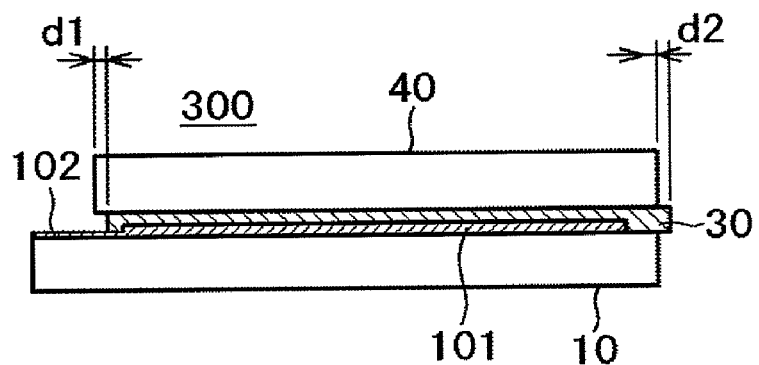

FIGS. 9A, 9B, and 9C illustrate differences in cross sections of the organic EL display panels 300 formed by the above-mentioned method, which are caused by differences in separation positions. FIG. 9A is a cross section B-B of an organic EL display panel (1) separated from the mother panel 200 illustrated in FIG. 8A. In FIG. 9A, the bonding agent sheet 30 is recessed inward by d1 from the end portion of the sealing substrate 40.

With regard to the B-B cross section, the bonding agent sheet 30 is sectioned with the removed bonding agent portions 31, which are formed in advance, and hence it is possible to design d1 as illustrated in FIG. 9A in advance. Specifically, it is possible to perform such control as to place, without fail, the bonding agent sheet 30 inward compared with the broken-out section of the sealing substrate 40 or the element substrate 10. In other words, in FIG. 9A, d1 can be set to zero or larger. Normally, the bonding agent sheet 30 causes compositional change in the course of bonding, and hence, considering this fact, d1 is set to around 0.3 mm.

FIG. 9B is a cross section C-C of an organic EL display panel (2) separated from the mother panel 200 illustrated in FIG. 8A. In FIG. 9B, the end portion of the organic EL display panel 300 includes surfaces obtained by breaking the sealing substrate 40, the bonding agent sheet 30, and the element substrate 10. The element substrate 10 and the sealing substrate 40 are made of glass, whereas the bonding agent sheet 30 is made of a resin. Accordingly, there occurs a difference in the way the element substrate 10, the sealing substrate 40, and the bonding agent sheet 30 are broken. As a result, as illustrated in FIG. 9B, the end portions of the glass substrates and the end portion of the bonding agent sheet 30 have irregular contours therebetween.

FIG. 9B illustrates a state in which the bonding agent sheet 30 at the right end portion protrudes by d2 from the end portions of the glass substrates. The amount of this protrusion is, for example, around 0.2 mm. On the other hand, at the left end portion of FIG. 9B, the bonding agent sheet 30 is recessed inward by d2 from the end portions of the glass substrates. This illustrates a state in which, when the bonding agent sheet 30 is broken, the end portion of the bonding agent sheet 30 is carried away by the adjacent organic EL display panel 300. FIG. 9B illustrates, for the sake of convenience, the state in which the bonding agent sheet 30 protrudes on the right side and is recessed on the left side, but this is only one example. Accordingly, for example, there may be a reverse case of the above-mentioned state, or there may be a case in which both the end portions of the bonding agent sheet 30 protrude. With this manufacturing method described above, there is a possibility that d2 fluctuates between plus 2 mm and minus 2 mm.

FIG. 9C is a cross section D-D of an organic EL display panel (3) separated from the mother panel 200 illustrated in FIG. 8A. In FIG. 9C, on the left-hand side of FIG. 9C, that is, at the terminal side end portion, the bonding agent sheet 30 is placed inward compared with the end portion of the sealing substrate 40. As described with reference to FIG. 9A, this portion can be controlled. On the other hand, on the right-hand side of FIG. 9C, that is, at the opposite side of the terminal portion 102, the bonding agent sheet 30 protrudes outward compared with the sealing substrate 40. As described with reference to FIG. 9B, the broken-out section of the bonding agent sheet 30 cannot be predicted, and hence there is a possibility that d2 fluctuates between plus 0.2 mm and minus 0.2 mm. Therefore, with the manufacturing method according to this embodiment of the present invention, there is provided a feature in which positional relations between the end portion of the bonding agent sheet 30 and the end portion of the sealing substrate 40 or the element substrate 10 are different depending on the broken-out sections of the organic EL display panels 300.

Second Embodiment

Figure 10A:
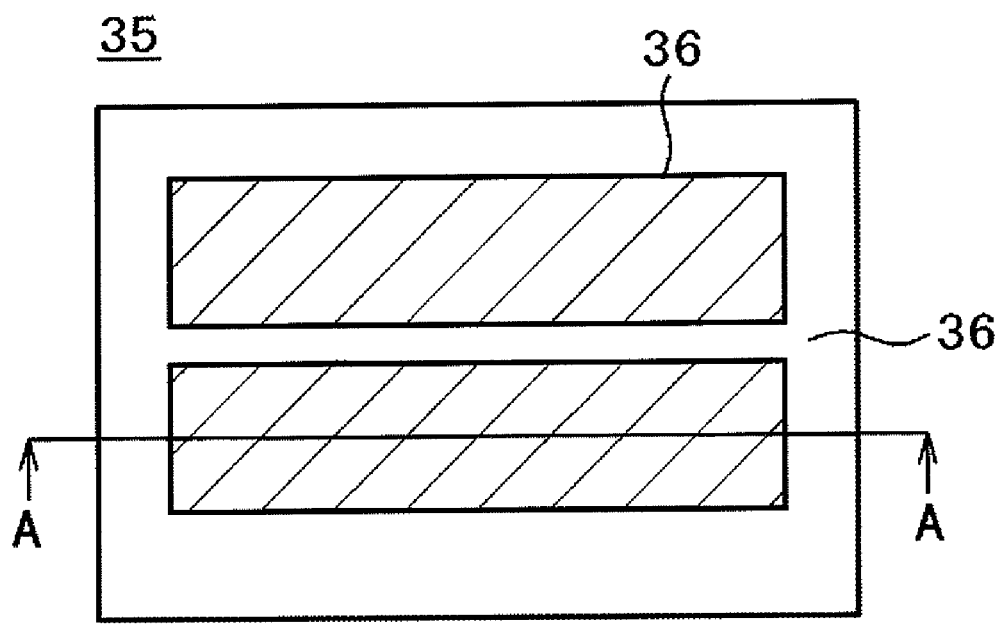
FIGS. 10A and 10B illustrate a bonding agent film according to a second embodiment of the present invention.
Figure 10B:
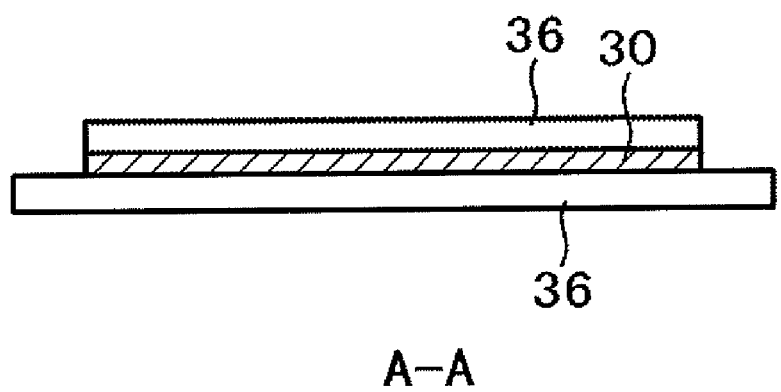

FIGS. 10A and 10B illustrate a bonding agent film 35 used in a second embodiment of the present invention. FIG. 10A is a plan view of the bonding agent film 35, and FIG. 10B is a cross section taken along the line A-A of FIG. 10A. The bonding agent film 35 illustrated in FIG. 10A is the same as the bonding agent film 35 according to the first embodiment illustrated in FIGS. 3A and 3B in that a bonding agent sheet 30 is first formed on the entire surface of a protection film 36, and the resultant sheet is sandwiched by another protection film 36. FIGS. 10A and 10B illustrate a state in which parts of one of the protection films 36 and the bonding agent sheet 30 are removed leaving necessary portions.

The bonding agent sheet 30 according to this embodiment has a reverse relation with the bonding agent sheet 30 according to the first embodiment. Specifically, according to the first embodiment, an unnecessary portion, that is, a portion which corresponds to the terminal portions 102 is removed from the bonding agent sheet 30, whereas, according to this embodiment, the bonding agent sheet 30 is provided only to a portion in which the bonding agent sheet 30 is necessary.

Figure 11A:
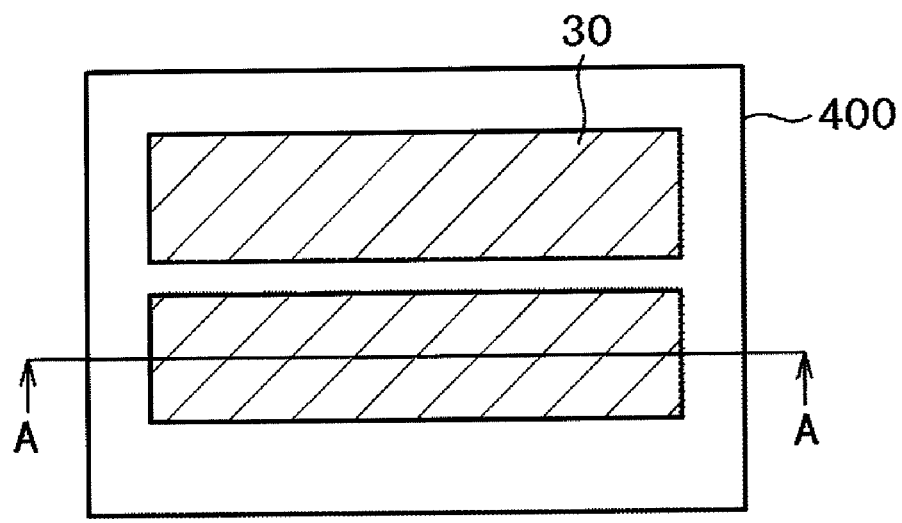
FIGS. 11A and 11B are diagrams illustrating a state in which a bonding agent sheet according to the second embodiment of the present invention is bonded to the mother sealing substrate.
Figure 11B:
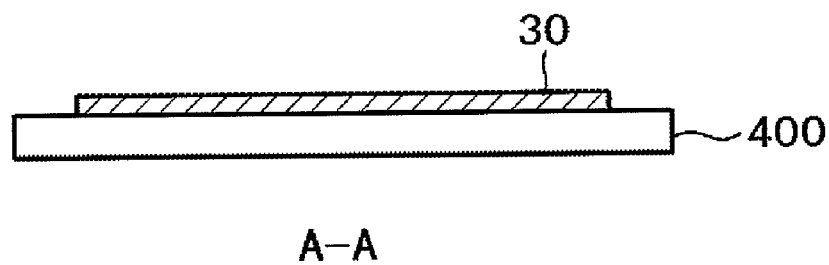

FIGS. 11A and 11B illustrate a state in which, after one of the protection films 36 illustrated in FIGS. 10A and 10B is peeled off and the bonding agent sheet 30 is bonded to the mother sealing substrate 400, the other one of the protection films 36 is removed. FIG. 11B is a cross section taken along the line A-A of FIG. 11A. The second embodiment is the same as the first embodiment in that the bonding agent sheet 30 is bonded to the sealing substrate 40 through heating in a reduced pressure atmosphere.

Figure 12A:
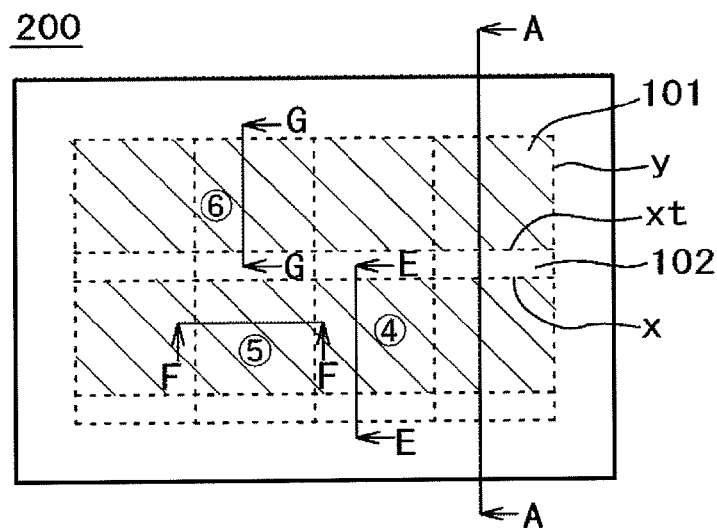
FIGS. 12A and 12B illustrate a mother panel according to the second embodiment of the present invention.
Figure 12B:
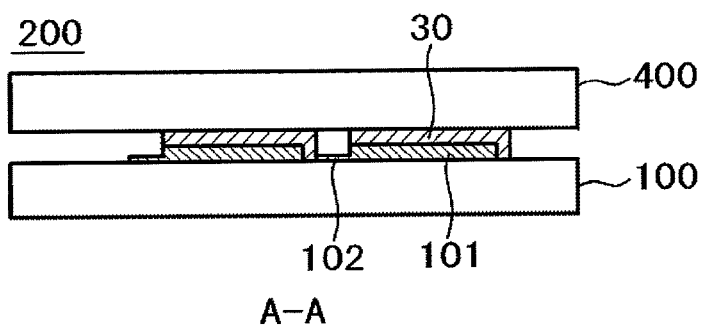

FIGS. 12A and 12B illustrate a mother panel 200 formed by bonding a mother sealing substrate 400 thus formed to the mother element substrate 100 which is separately formed. The mother element substrate 100 separately formed is the same as the mother element substrate 100 illustrated in FIG. 7. Further, a method of bonding the mother element substrate 100 and the mother sealing substrate 400 together is the same as the method described in the first embodiment. FIG. 12A is a plan view of the mother panel 200, and FIG. 12B is a cross section taken along the line A-A of FIG. 12A.

In FIG. 12A, a hatched portion indicates a portion to which the bonding agent sheet 30 is provided. Scribing is carried out along a dashed line x and a dashed line y illustrated in FIG. 12A from the mother element substrate 100 side, and also, scribing is carried out along a dashed line xt illustrated in FIG. 12A from the mother sealing substrate 400 side. After that, by inflicting an impact on the glass substrate from the mother sealing substrate 400 side, the mother panel 200 is separated into individual organic EL display panels. Further, by inflicting an impact on the separated organic EL display panel 300 from the sealing substrate 40 side, a part of the sealing substrate 40 is removed, thereby exposing the terminal portion 102.

According to this embodiment, the configuration of the bonding agent sheet 30 is different from the configuration of the bonding agent sheet 30 according to the first embodiment, and hence there may be a case in which a cross section of the organic EL display panel 300 is different from a cross section of the organic EL display panel 300 according to the first embodiment. A cross section E-E of an organic EL display panel (4) separated from the mother panel 200 illustrated in FIG. 12A is the same as the cross section of FIG. 9A according to the first embodiment. The bonding agent sheet 30 in this portion can be designed in advance, and hence the end portion of the bonding agent sheet 30 can be controlled.

Across section F-F of an organic EL display panel (5) separated from the mother panel 200 illustrated in FIG. 12A has the same configuration as the configuration illustrated in FIG. 9B according to the first embodiment. Specifically, the end portions of the bonding agent sheet 30 show irregularities. On the other hand, a cross section G-G of an organic EL display panel (6) separated from the mother panel 200 illustrated in FIG. 12A is the same as the cross section of FIG. 9A according to the first embodiment. This is because, in this embodiment, the cross section of this portion is the same as the cross section E-E of the organic EL display panel (4).

Third Embodiment

Figure 13:
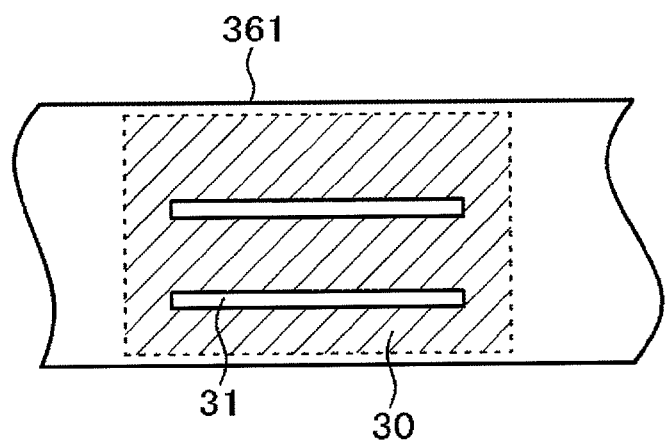
FIG. 13 illustrates an example of a roll-form bonding agent film according to a third embodiment of the present invention.
Figure 14:
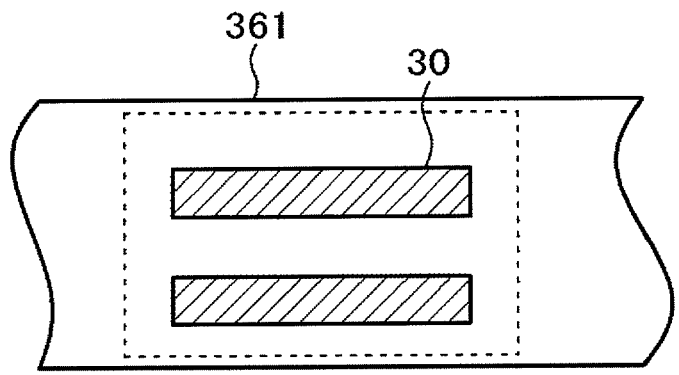
FIG. 14 illustrates another example of the roll-form bonding agent film according to the third embodiment of the present invention.

As described in the first embodiment and the second embodiment, the bonding agent sheet 30 may be bonded on each mother sealing substrate 400, but in a case of mass production, this is not necessarily efficient in terms of area for manufacture. FIGS. 13 and 14 illustrate examples for solving the above-mentioned problem.

FIG. 13 illustrates a case in which a large number of the bonding agent sheets 30 according to the first embodiment are bonded to the protection film 36, thereby forming a roll-form film 361. In FIG. 13, dashed lines indicate an assumed outline of the mother sealing substrate 400. The roll-form film 361 is supplied from the left-hand side of FIG. 13, and then, the bonding agent sheet 30 is transferred onto the mother sealing substrate 400. Then, the protection film 36 after the transfer is reeled in on the right-hand side.

FIG. 14 illustrates an example in which the bonding agent sheet 30 used in the second embodiment is formed into a roll-form bonding agent film 361. In FIG. 14, dashed lines indicate an assumed outline of the mother sealing substrate 400. Similarly to the case of FIG. 13, in FIG. 14, the roll-form bonding agent film 361 is supplied from the left-hand side, and, after the bonding agent sheet 30 is transferred onto the mother sealing substrate 400, the protection film 36 is reeled in on the right-hand side.

With the configuration of FIG. 13 or FIG. 14, the bonding agent sheets 30 can be efficiently bonded to a large number of mother substrates. Besides, the protection film 36 is reeled into a roll, and hence there is no need to secure a large area for manufacture.

Fourth Embodiment

According to the first to third embodiments, the element substrate 10 and the sealing substrate 40 are bonded together by means of the bonding agent sheet 30, and, at the same time, the bonding agent sheet 30 is provided with moisture proof property. In this embodiment, instead of using the bonding agent sheet 30 as a bonding agent, a bonding agent 38 is directly printed onto the mother sealing substrate 400 through coating.

Figure 15A:
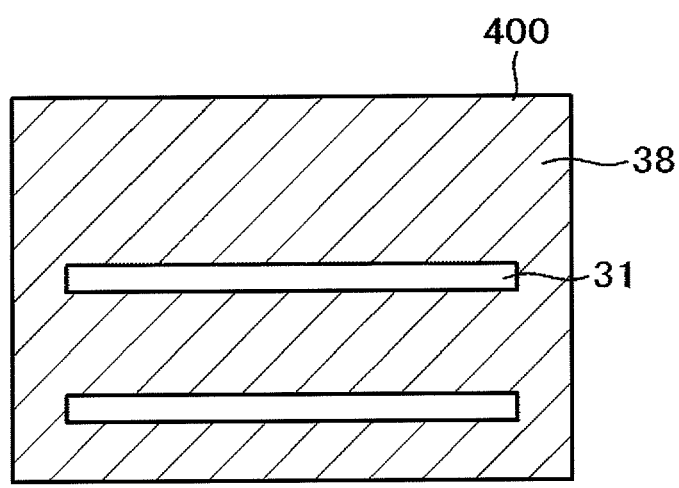
FIGS. 15A and 15B illustrate examples in which a bonding agent is formed on mother sealing substrates through printing.
Figure 15B:
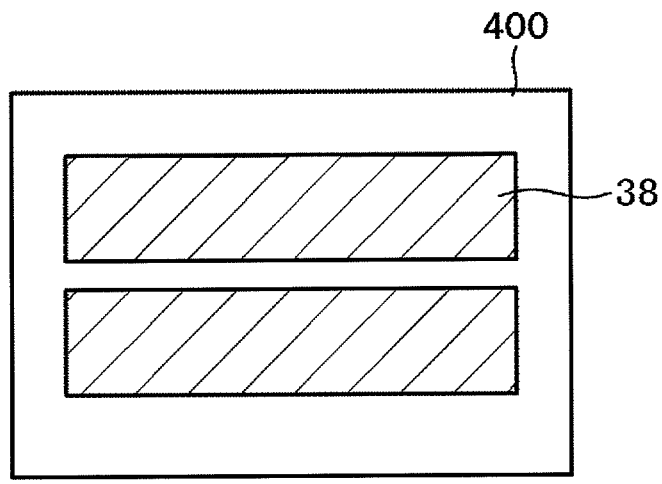
Figure 16A:
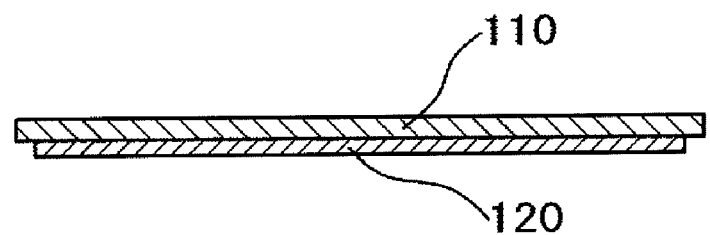
FIGS. 16A to 16D are diagrams illustrating an example of related art.
Figure 16B:
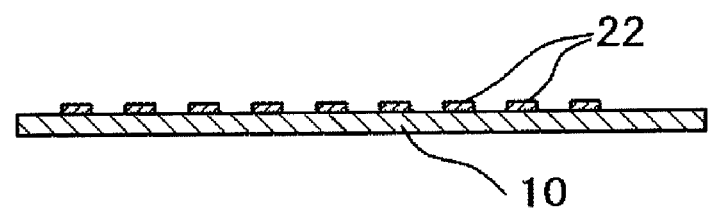
Figure 16C:
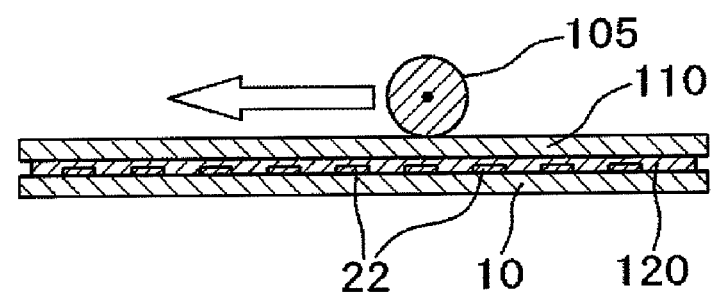
Figure 16D:
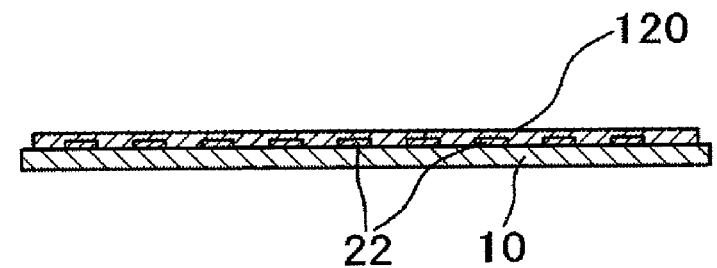
Figure 17A:
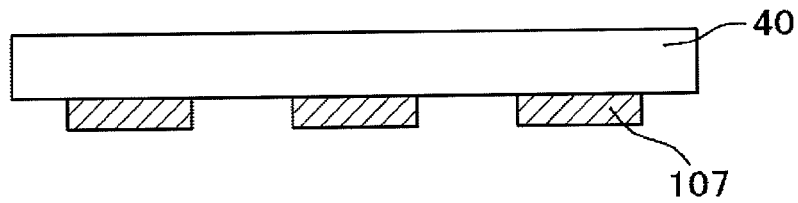
FIGS. 17A to 17E are diagrams illustrating another example of the related art.
Figure 17B:
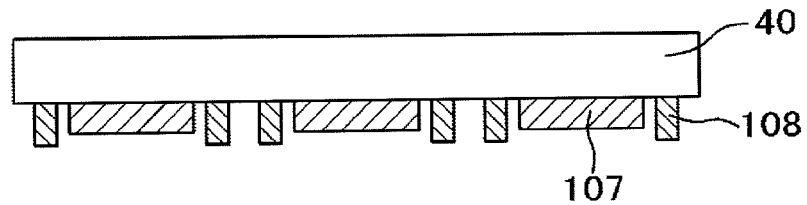
Figure 17C:
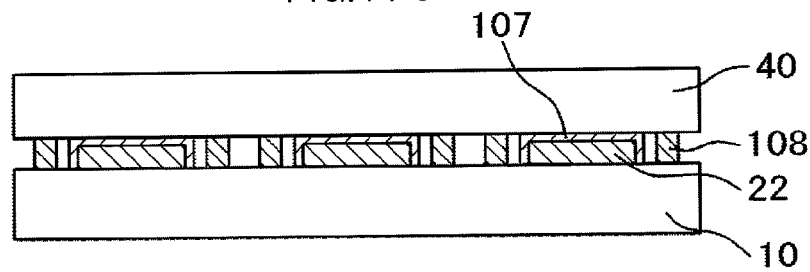
Figure 17D:
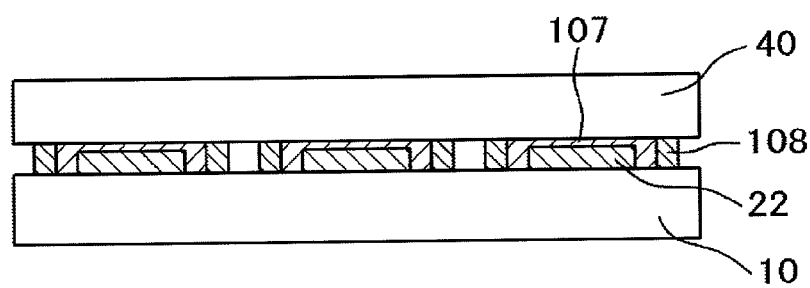
Figure 17E:
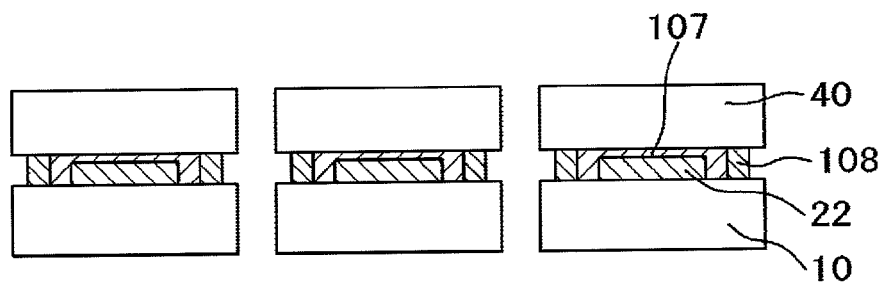
Figure 18A:
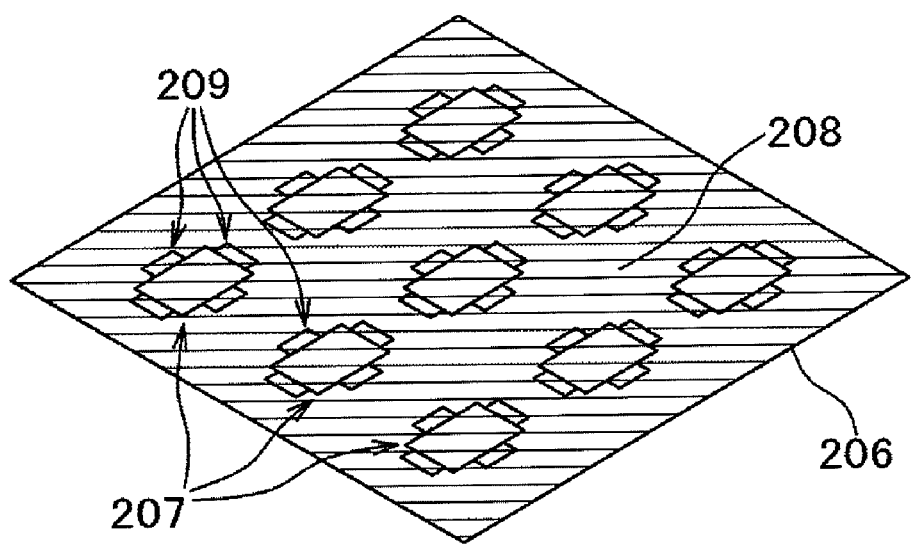
FIGS. 18A and 18B are diagrams illustrating yet another example of the related art.
Figure 18B:
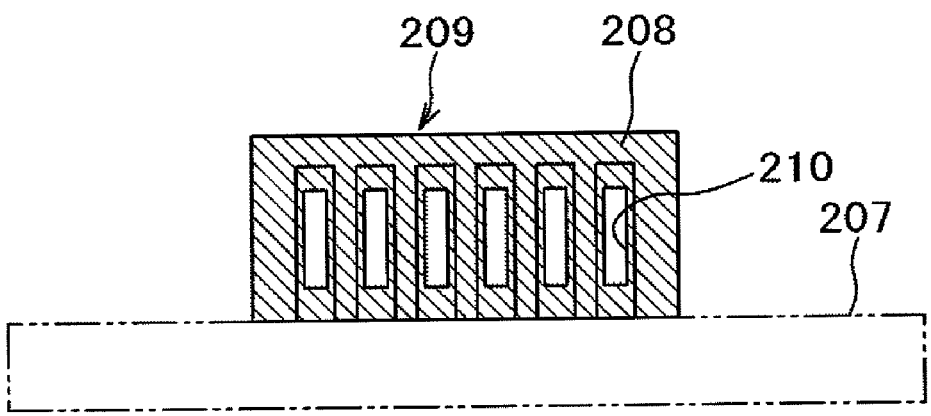

FIG. 15A illustrates a state in which the bonding agent 38 having the same configuration as the bonding agent sheet 30 according to the first embodiment is formed into a coating film. FIG. 15B illustrates a state in which the bonding agent 38 having the same configuration as the bonding agent sheet 30 according to the second embodiment is formed into a coating film. The coating film does not require high accuracy, and hence can be formed through, for example, screen printing.

As a material for the bonding agent 38 to be printed, for example, an epoxy resin or an acrylic resin can be employed. Thickness of the printed film is, for example, from 10 μm to 20 μm. The thickness of the printed film may be thinner as long as sufficient bonding between the element substrate 10 and the sealing substrate 40 is secured.

In this manner, after the bonding agent 38 is formed onto the mother sealing substrate 400 through printing as illustrated in FIG. 15A or 15B, the bonding agent 38 is subjected to pre-baking at a temperature of around 80° C. and is semi-cured. The semi-cured bonding agent 38 comes to have a certain degree of bonding power. Then, the mother element substrate 100 and the mother sealing substrate 400 are bonded together by means of the semi-cured bonding agent 38, thereby manufacturing the mother panel 200. After that, final baking is performed at 100° C. for 2 hours or 120° C. for 30 minutes. After the final baking, the mother element substrate 100 and the mother sealing substrate 400 are firmly bonded together, and a moisture resistant effect due to the bonding agent 38 can also be obtained.

After that, the mother panel 200 is separated into individual organic EL display panels 300. The separation method is as described in the first embodiment. The broken-out sections of the separated individual organic EL display panels 300 are the same as those described in the first embodiment or the second embodiment. Specifically, the organic EL display panels 300 formed from the configuration illustrated in FIG. 15A have such cross sections as described in the first embodiment, whereas the organic EL display panels 300 formed from the configuration illustrated in FIG. 15B have such cross sections as described in the second embodiment.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A method of manufacturing an organic electroluminescence display device which comprises:
   an element substrate comprising:
      a display region; and
      a terminal portion;
   a bonding agent sheet formed to cover the display region; and
   a sealing substrate bonded to the bonding agent sheet,
   the method of manufacturing an organic electroluminescence display device comprising:
   forming the organic electroluminescence display device by separating a mother panel,
      the mother panel comprising:
         a mother sealing substrate having a plurality of the sealing substrates formed thereon;
         a mother element substrate having a plurality of the element substrates formed thereon; and
         the bonding agent sheet for bonding the mother sealing substrate and the mother element substrate;
   removing a region corresponding to a terminal portion of the bonding agent sheet while the bonding agent sheet is in solid form; and
   bonding the bonding agent sheet to the mother sealing substrate, after the region corresponding to the terminal portion has been removed, in a manner that the bonding agent sheet in a solid form covers a plurality of the display regions formed on the mother element substrate and in a manner that the bonding agent sheet does not cover a plurality of the terminal portions formed on the mother element substrate.

2. A method of manufacturing an organic electroluminescence display device according to claim 1, wherein:
- the bonding agent sheet bonded to the mother sealing substrate comprises one bonding agent sheet; and
- the bonding agent sheet is removed from portions corresponding to the plurality of the terminal portions of the plurality of the element substrates formed on the mother element substrate.

3. A method of manufacturing an organic electroluminescence display device according to claim 1, wherein:
- a plurality of the bonding agent sheets are bonded to the mother sealing substrate to cover the plurality of the display regions formed on the plurality of the element substrates; and
- the plurality of the bonding agent sheets avoid covering portions corresponding to the plurality of the terminal portions of the plurality of the element substrates formed on the mother element substrate.

4. A method of manufacturing an organic electroluminescent display device according to claim 1, wherein the bonding agent sheet is comprised of a sealing material in sheet form.

5. A method of manufacturing an organic electroluminescent display device according to claim 4, wherein said sealing material comprises a thermosetting epoxy resin in sheet form.

6. A method of manufacturing an organic electroluminescent display device according to claim 4, wherein said sealing material comprises an acrylic resin in sheet form.

7. A method of manufacturing an organic electroluminescent display device according to claim 4, wherein said sealing material comprises a silicon resin in sheet form.

8. A method of manufacturing an organic electroluminescent display device according to claim 1, wherein the bonding agent sheet is comprised of a moisture proof material in sheet form.

9. An organic electroluminescence display device, comprising:
- an element substrate comprising:
  - a display region; and
  - a terminal portion;
- a bonding agent sheet formed to cover the display region; and
- a sealing substrate bonded to the bonding agent sheet, wherein:
  - on a side of the sealing substrate, which has the terminal portion formed thereon, an end portion of the bonding agent sheet is recessed inward from the end portion of the sealing substrate; and
  - on at least one of two sides perpendicular to the side having the terminal portion formed, another end portion of the bonding agent sheet protrudes outward from another end portion of the sealing substrate or an end portion of the element substrate.

10. An organic electroluminescence display device according to claim 9, wherein, on an opposite side of the side having the terminal portion formed, yet another end portion of the bonding agent sheet protrudes outward from yet another end portion of the sealing substrate or another end portion of the element substrate or is aligned on the same plane as the yet another end portion of the sealing substrate or the another end portion of the element substrate.

11. An electroluminescent display device according to claim 9, wherein the bonding agent sheet is comprised of a sealing material in sheet form.

12. An electroluminescent display device according to claim 11, wherein said sealing material comprises a thermosetting epoxy resin in sheet form.

13. An organic electroluminescent display device according to claim 11, wherein said sealing material comprises an acrylic resin in sheet form.

14. An organic electroluminescent display device according to claim 11, wherein said sealing material comprises a silicon resin in sheet form.

15. An organic electroluminescent display device according to claim 9, wherein the bonding agent sheet is comprised of a moisture proof material in sheet form.

* * * * *